(12) United States Patent
Mitra et al.

(10) Patent No.: US 7,240,260 B2
(45) Date of Patent: Jul. 3, 2007

(54) STIMULUS GENERATION

(75) Inventors: Subhasish Mitra, Rancho Cordova, CA (US); Kee Sup Kim, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 602 days.

(21) Appl. No.: 10/317,605

(22) Filed: Dec. 11, 2002

(65) Prior Publication Data

US 2004/0117703 A1   Jun. 17, 2004

(51) Int. Cl.
*G01R 31/3183* (2006.01)
*G01R 31/316* (2006.01)

(52) U.S. Cl. ................ 714/726; 714/724; 714/752
(58) Field of Classification Search ........... 714/726, 714/755, 752, 33, 730, 781, 782, 784, 724; 326/16; 324/765
See application file for complete search history.

(56) References Cited

U.S. PATENT DOCUMENTS

| | | | |
|---|---|---|---|
| 4,241,307 A | 12/1980 | Hong | |
| 4,503,537 A | 3/1985 | McAnney | |
| 4,712,590 A * | 12/1987 | Gianfilippo | ............ 141/83 |
| 4,744,084 A * | 5/1988 | Beck et al. | ............ 714/33 |
| 5,271,019 A * | 12/1993 | Edwards et al. | ........ 714/730 |
| 5,312,963 A | 5/1994 | Pariza et al. | |
| 5,313,469 A | 5/1994 | Adham et al. | |
| 5,375,091 A | 12/1994 | Berry, Jr. et al. | |
| 5,450,415 A | 9/1995 | Kamada | |
| 5,504,756 A | 4/1996 | Kim et al. | |
| 5,517,511 A * | 5/1996 | Hardwick et al. | .......... 714/755 |
| 5,528,604 A | 6/1996 | El-Maleh et al. | |
| 5,574,733 A | 11/1996 | Kim | |
| 5,612,963 A | 3/1997 | Koenemann et al. | |
| 5,617,426 A | 4/1997 | Koenemann et al. | |
| 5,737,340 A | 4/1998 | Tamarapalli et al. | |
| 5,831,992 A | 11/1998 | Wu | |
| 5,894,213 A | 4/1999 | Nakamura | |
| 5,991,898 A | 11/1999 | Rajski et al. | |
| 5,991,909 A | 11/1999 | Rajski et al. | |
| 6,041,429 A | 3/2000 | Koenemann | |
| 6,059,451 A | 5/2000 | Scott et al. | |
| 6,070,261 A | 5/2000 | Tamarapalli et al. | |

(Continued)

OTHER PUBLICATIONS

Becher, Logical Design Using Integrated Circuits, Hayden Book Comapny, Inc., 1977, p. 79.*

(Continued)

*Primary Examiner*—Guy Lamarre
*Assistant Examiner*—Dipakkumar Gandhi
(74) *Attorney, Agent, or Firm*—Erick R. Nordstrom

(57) ABSTRACT

In one embodiment, a method is provided. In the method of this embodiment, a stimulus signal set may be generated and supplied, as input, to first circuitry. Each respective stimulus signal in the stimulus signal set may be generated based at least in part upon a respective non-null subset of an input signal set. No two respective stimulus signals in the stimulus signal set may be generated based upon the same respective non-null subset of the input signal set. The stimulus signal set may include a respective number of stimulus signals that is greater than a respective number of input signals in the input signal set. Of course, many modifications, variations, and alternatives are possible without departing from the method of this embodiment.

32 Claims, 4 Drawing Sheets

U.S. PATENT DOCUMENTS

| | | | |
|---|---|---|---|
| 6,327,687 | B1 | 12/2001 | Rajski et al. |
| 6,353,842 | B1 | 3/2002 | Rajski et al. |
| 6,400,173 | B1 * | 6/2002 | Shimizu et al. ............ 324/765 |
| 6,401,226 | B1 | 6/2002 | Maeno |
| 6,421,794 | B1 | 7/2002 | Chen et al. |
| 6,557,129 | B1 | 4/2003 | Rajski et al. |
| 6,574,762 | B1 | 6/2003 | Karimi et al. |
| 6,636,998 | B1 | 10/2003 | Lee et al. |
| 6,681,324 | B1 * | 1/2004 | Anderson ..................... 713/1 |
| 6,829,740 | B2 | 12/2004 | Rajski et al. |
| 6,918,074 | B2 | 7/2005 | Kim et al. |
| 2002/0112199 | A1 | 8/2002 | Whetsel |
| 2002/0124217 | A1 | 9/2002 | Hiraide et al. |
| 2003/0079165 | A1 * | 4/2003 | Ffrench et al. ............ 714/726 |
| 2003/0115521 | A1 | 6/2003 | Rajski et al. |
| 2003/0154433 | A1 | 8/2003 | Wang et al. |
| 2003/0167430 | A1 * | 9/2003 | Barbera et al. ............ 714/727 |
| 2003/0188269 | A1 | 10/2003 | Mitra et al. |
| 2005/0055613 | A1 | 3/2005 | Mitra et al. |
| 2006/0036985 | A1 | 2/2006 | Mitra et al. |
| 2006/0041814 | A1 | 2/2006 | Rajski et al. |

OTHER PUBLICATIONS

Al-Yamani, Ahmad A., et al., "Testing Digital Circuits With Constraints", Proceedings of the 17th IEEE International Symposium on Defect and Fault Tolerance in VLSI Systems, pp. 195-203 (Nov. 6-8, 2002).

Cattell, Kevin et al., "Synthesis of One-Dimensional Linear Hybrid Cellular Automata", IEEE Transactions on Computer-Aided Design of Integrated Circuits and Systems, vol. 15, No. 3, pp. 325-335 (Mar. 1996).

Hamzaoglu, Ilker, et al., "Reducing Test Application Time for Ful Scan Embedded Cores", Twenty-Ninth Annual International Symposium on Fault-Tolerance Computing, Digest of Papers, pp. 260-267 (Jun. 15-18, 1999).

Ivanov, Andre, et al., "Programmable BIST Space Compactors", IEEE Transactions on Computers, vol. 45, No. 12, pp. 1393-1404 (Dec. 1996).

Khoche, Ajay, et al., "Test Vector Compression Using EDA-ATE Synergies", Proceedings of the 20th IEEE VLSI Test Symposium (VTS), pp. 97-102 (Apr. 28-May 2, 2002).

Kim, Kee Sup, et al., "Multi-Frequency, Multi-Phase Scan Chain", Proceedings of the International Test Conference, pp. 323-330 (Oct. 2-6, 1994).

Mitra, S., et al., "On Incorporation of BIST for the Synthesis of Easily and Fully Testable Controllers", Proceedings of the Tenth International Conference on VLSI Design, pp. 547-562 (Jan. 4-7, 1997).

Mitra, Subbasish, et al., "Scan Synthesis for One-Hot Signals" Proceedings of the International Test Conference, pp. 714-722 (Nov. 1-6, 1997).

Mitra, Subhasish, et al., "An Output Encoding Problem and a Solution Technique", Proceedings of the 1997 IEEE/ACM International Conference on Computer-Aided Design, pp. 304-307 (Nov. 9-13, 1997).

Mitra, Subhasish, et al., "An Output Encoding Problem and a Solution Technique", IEEE Transactions on Computer-Aided Design of Integrated Circuits and Systems, vol. 18, No. 6, pp. 761-768 (Jun. 1999).

Mitra, Subhasish, et al., "Design for Testability and Testing of IEEE 1149.1 TAP Controller", Proceedings of the 20th IEEE VLSI Test Symposium (VTS), pp. 247-252 (Apr. 28-May 2, 2002).

Mitra, Subhasish, et al., "X-Compact: An Efficient Response Compaction Technique for Test Cost Reduction", Proceedings of the International Test Conference, pp. 311-320 (Oct. 7-10, 2002).

Mitra, Subhasish, et al., "XMAX: X-Tolerant Architecture for MAXimal Test Compression", Proceedings of the 21st International Conference on Computer Design, pp. 326-330 (Oct. 13-15, 2003).

Seera, Micaela, et al., "Space Compaction for Multiple-Output Circuits", IEEE Transactions on Computer-Aided Design of Integrated Circuits and Systems, vol. 7, No. 10, pp. 1105-1113 (Oct. 1988).

Volkerink, Erik H., et al., "Packet-Based Input Test Data Compression Techniques", Proceedings of the International Test Conference, pp. 154-163 (Oct. 7-10, 2002).

Wohl, Peter, et al., "Design of Compactors for Signature-Analyzers in Built-In Self-Test", Proceedings of the International Test Conference, pp. 154-163 (Oct. 30-Nov. 1, 2001).

* cited by examiner

STIMULUS GENERATION

CROSS-REFERENCE TO RELATED APPLICATION

The subject application is related to co-pending U.S. patent application Ser. No. 10/107,628, entitled "Compacting Circuit Responses," filed Mar. 27, 2002, and assigned to the Assignee of the subject application.

FIELD

This disclosure relates to the field of stimulus generation.

BACKGROUND

In one conventional integrated circuit test technique, the integrated circuit includes built-in scan chains for testing. During testing of the integrated circuit, each scan chain receives, via a respective input terminal of the integrated circuit, test inputs from an external test input generator, and generates test outputs in response to these inputs. The test outputs generated by the scan chains are supplied, via respective output terminals of the integrated circuit, to an external test analyzer. The test analyzer compares the test outputs that it receives to expected outputs to determine therefrom whether the integrated circuit is operating properly.

The cost of testing integrated circuits using this conventional technique typically is related to factors such as the time involved in carrying out the test and test complexity. Typically, these factors may be related to other factors, such as, the volume of test inputs supplied to the integrated circuit by the test input generator, the volume of test outputs analyzed by the test analyzer, and the cost of the test input generator and the test analyzer. By increasing the number of input and output terminals via which such inputs and outputs are propagated to and from, respectively, the integrated circuit, the time involved in carrying out such testing may be reduced, at least to some extent. However, increasing the number of input and output terminals may result in increasing the integrated circuit's packaging size and manufacturing cost.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

Although the following Detailed Description will proceed with reference being made to illustrative embodiments, many alternatives, modifications, and variations thereof will be apparent to those skilled in the art. Accordingly, it is intended that the claimed subject matter be viewed broadly, and be defined only as set forth in the accompanying claims.

DETAILED DESCRIPTION

Figure 1:
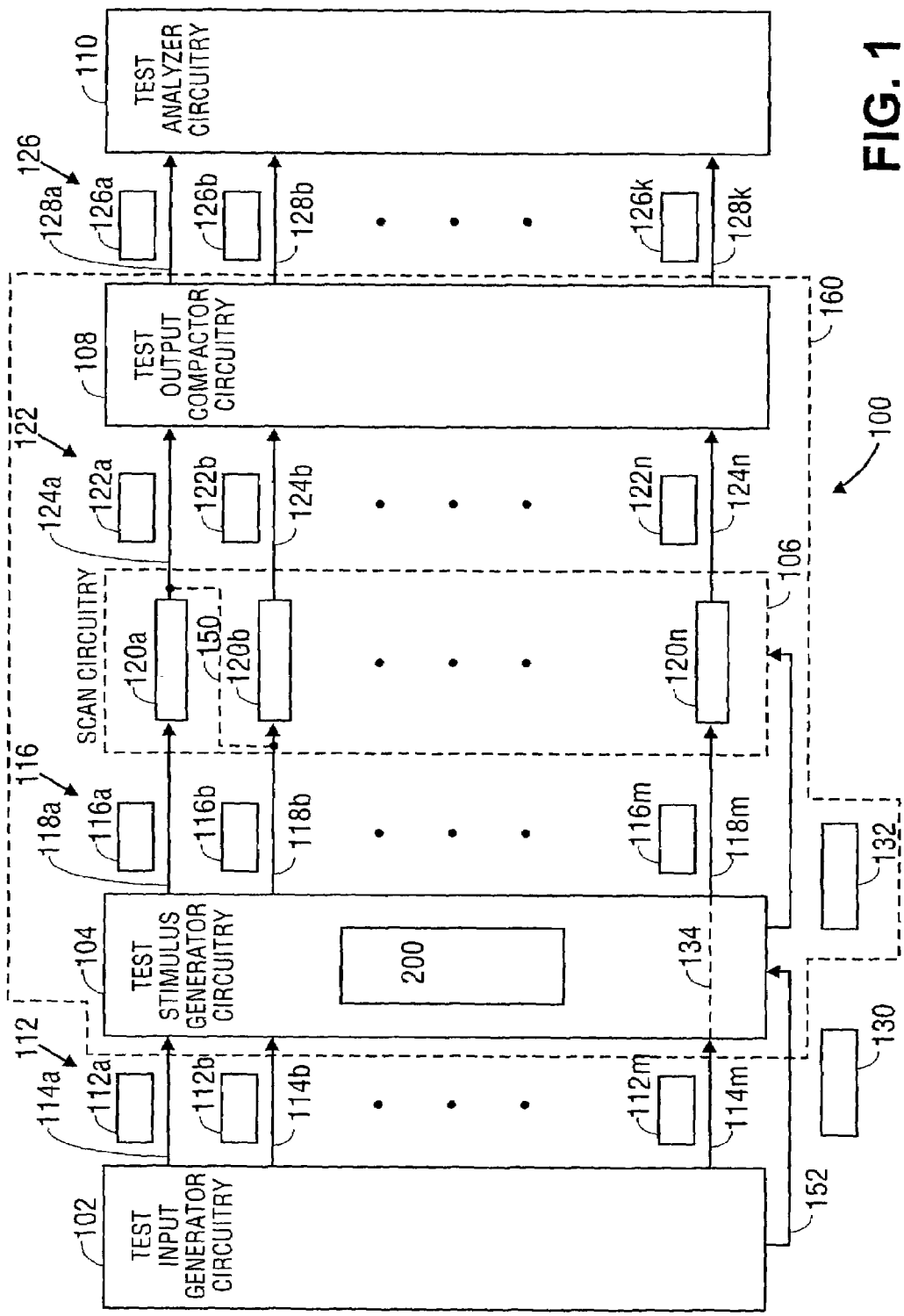
FIG. 1 is a diagram illustrating a system embodiment.

FIG. 1 illustrates a system embodiment 100. As shown in FIG. 1, system embodiment 100 may comprise test input generator circuitry 102, integrated circuit 160, and test output analyzer circuitry 110. As used herein, an "integrated circuit" means a semiconductor device and/or microelectronic device, such as, for example, a semiconductor integrated circuit chip. Integrated circuit 160 may comprise test stimulus generator circuitry 104, scan circuitry 106, and test output compactor circuitry 108. Test stimulus generator circuitry 104 may comprise stimulus signal set generator circuitry 200. Scan circuitry 106 may comprise one or more, and in this embodiment, a plurality of test scan chains 120$a$, 120$b$, ... 120$n$. Scan chains 120$a$, 120$b$, ... 120$n$ and/or scan circuitry 106 may comply and/or be compatible with, for example, "Standard Test Access Port and Boundary-Scan Architecture," IEEE Std. 1149.1-1990, published 1990, available from Institute of Electrical and Electronics Engineers, Inc., New York, N.Y., United States of America. Although not shown in the Figures, scan chains 120$a$, 120$b$, ... 120$n$ and/or scan chain circuitry 106 may be coupled to circuitry in integrated circuit 160 whose functionality and/or operation is intended to undergo testing by scan chains 120$a$, 120$b$, ... 120$n$ and/or scan chain circuitry 106.

Test input generator circuitry 102 may be coupled to test stimulus generator circuitry 104 via one or more, and in this embodiment, a plurality of external input terminals and/or signal lines (collectively or singly referred to hereinafter as "input terminals 114$a$, 114$b$, ... and/or 114$m$") that may be comprised in integrated circuit 160. In operation, circuitry 102 may supply to circuitry 104 a test input signal set (collectively referred to by numeral 112 in FIG. 1) via one or more of input terminals 114$a$, 114$b$, ... 114$m$. System 100 may be a synchronous system. Input signal set 112 may comprise one or more, and in this embodiment, a plurality of input signals that maybe input, during respective clock periods of system 100, to circuitry 104 via respective input terminals 114$a$, 114$b$, ... 114$m$. For example, during one such respective clock period, input signals 112$a$, 112$b$, ... 112$m$ may be provided, as input, to circuitry 104 via respective input terminals 114$a$, 114$b$, ... 114$m$.

In response to and/or based upon, at least in part, input signal set 112, circuitry 200 may generate, as output, stimulus signal set 116. Depending upon one or more control signals 130 supplied to circuitry 104 by circuitry 102, the respective stimulus signals comprised in stimulus signal set 116 may be supplied, as input, to respective scan chains 120$a$, 120$b$, ... 120$n$ in circuitry 106, via respective signal lines 118$a$, 118$b$, ... 118$n$. For example, in response to and/or based upon, at least in part, input signals 112$a$, 112$b$, ... 112$m$, circuitry 200 may generate, as respective outputs, stimulus signals 116$a$, 116$b$, ... 116$n$ that may be supplied, as inputs, to respective scan chains 120$a$, 120$b$, ... 120$n$ via respective signal lines 118$a$, 118$b$, ... 118$n$.

In this embodiment, in response to and/or based upon, at least in part, stimulus signal set 116, scan circuitry 106 may generate, as outputs, a plurality of output signals 122. Output signals 122 may correspond to, represent, comprise, and/or embody the results of scan testing of circuitry in integrated circuit 160 by scan chains 120$a$, 120$b$, ... 120$n$. Output signals 122 may be supplied, as inputs, to test output compactor circuitry 108 via signal lines 124$a$, 124$b$, ... 124$n$. For example, in this embodiment, in response and/or based upon, at least in part, stimulus signals 116$a$, 116$b$, ... 116$n$, respective scan chains 120$a$, 120$b$, ... 120$n$ may generate, as respective outputs, output signals 122$a$, 122$b$, .

. . . 122n that may be supplied, as inputs, to circuitry 108 via respective signal lines 124a, 124b, . . . 124n.

In response to and/or based upon, at least in part, output signals 122, circuitry 108 may generate, as outputs, a plurality of output signals 126 that may be supplied, as inputs, to test analyzer circuitry 110. Circuitry 108 may comprise a linear network including combinational or sequential logic that may be substantially in accordance with, e.g., the teachings of co-pending U.S. patent application Ser. No. 10/107,628, entitled "Compacting Circuit Responses," filed Mar. 27, 2002, and assigned to the Assignee of the subject application. Of course, without departing from this embodiment, circuitry 108 may comprise other and/or different types of circuitry. Indeed, many modification and variations of the circuitry described in said co-pending U.S. patent application are within the purview of those skilled in art, and may be used without departing from this embodiment. In accordance with one embodiment, output signals 126 may be representative of output signals 122, but the number of output signals 126 generated by circuitry 108 in response to and/or based upon, at least in part, output signals 122, may be significantly less than the number of scan chains 120a, 120b, . . . 120n or the number of output signals 122. For example, in this embodiment, in response to and/or based upon output signals 122a, 122b, . . . 122n, compactor circuitry 108 may generate and supply to test output analyzer circuitry 110 respective output signals 126a, 126b, . . . 126k comprised in output signals 126 via output signal lines 128a, 128b, . . . 128k, respectively.

Test analyzer circuitry 110 may compare output signals 126 to predetermined, expected output signals, generated, for example, based at least in part upon computer simulations of expected operation of system 100. Based at least in part upon this comparison, test analyzer circuitry 110 may determine whether circuitry in integrated circuit 160 that is intended to be tested by scan chains 120a, 120b, . . . 120n is functioning properly and/or as expected. Input signal set 112 generated by circuitry 102 may be predetermined and/or empirically determined, for example, based at least in part upon computer simulations of expected operation of system 100, so as to permit output signals 126 to be deterministically generated by circuitry 108 and representative of whether circuitry in integrated circuit 160 that is intended to be tested by scan chains 120a, 120b, . . . 120n is functioning properly and/or as expected.

In this embodiment, during operation of system 100, circuitry 102 also may provide to circuitry 104 one or more control signals 130 via one or more control signal terminals and/or lines (collectively or singly referred to hereinafter as "control signal terminal 152"). By so supplying one or more control signals 130 to circuitry 104, circuitry 102 may select which of the input signals in set 112 may be supplied, as input, to circuitry 200, and which of the input signals in set 112 may be directly supplied, via, for example, a respective signal line in circuitry 104, to a respective associated scan chain in circuitry 106. For example, by supplying one or more appropriate control signals 130 to circuitry 104, circuitry 102 may command that input terminal 114m is directly coupled to input signal line 118n via signal line 134. This may result in input terminal 114m being coupled to signal line 118n, one of the output signal lines of circuitry 200 being de-coupled from signal line 118n, and input signal 112m being directly supplied, as input, to scan chain 120n. Also for example, alternatively, by supplying one or more appropriate control signals 130 to circuitry 104 via control signal terminal 152, circuitry 102 may select that all of the input signals in set 112 may be supplied, as input, to circuitry 200. This may result in each of the output signal lines of circuitry 200 being coupled to respective signal lines 118a, 118b, . . . 118n, such that respective outputs generated by circuitry 200 may be propagated via respective signal lines of circuitry 200 to respective signal lines 118a, 118b, . . . 118n.

Also in this embodiment, during operation of system 100, circuitry 104 also may provide to circuitry 106 one or more control signals 132. By so supplying one or more control signals 132 to circuitry 106, circuitry 104 may select which of the scan chains 120a, 120b, . . . 120n may be coupled together to form relatively larger scan chains (e.g., relative to one or more relatively smaller scan chains in circuitry 106). For example, by supplying one or more appropriate control signals 132 to circuitry 106, circuitry 104 may command that scan chain 120a is coupled to scan chain 120b, via, e.g., connection 150, to form a relatively larger scan chain that is larger than relatively smaller scan chain 120n. This may result in the output of scan chain 120a being so coupled to the input of scan chain 120b, signal line 118b being de-coupled from scan chain 120b, and signal line 124a being de-coupled from scan chain 120a. After scan chain 120a and scan chain 120b are so coupled together to form the relatively longer scan chain, circuitry 104 may supply to the input of this relatively longer scan chain one or more stimulus signals (e.g., stimulus signal 116a). One or more control signals 132 may be generated by circuitry 104 in response to and/or based upon, at least in part, e.g., one or more commands 130 from circuitry 102.

Without departing from this embodiment, instead of being comprised in integrated circuit 160, circuitry 104, 106, and/or 108 may be comprised in one or more other types of electronic devices, such as, for example, one or more circuit boards, circuit panels, and/or multi-chip modules. In this alternate arrangement, scan circuitry 106 may be used to test circuitry comprised in such one or more circuit boards, circuit panels, and/or multi-chip modules.

In this embodiment, the number of input signals 112a, 112b, . . . 112n comprised in input signal set 112 may be significantly less than the number of scan chains 120a, 120b, . . . 120n comprised in circuitry 106, the number of output signals 122a, 122b, . . . 122n comprised in output signals 122, or the number of stimulus signals 116a, 116b, . . . 116n comprised in stimulus signal set 116. Also in this embodiment, the number of stimulus signals 116a, 116b, . . . 116n comprised in stimulus signal set 116 may be equal to the number of scan chains 120a, 120b, . . . 120n, and also may be equal to the number of output signals 122a, 122b, . . . 122n comprised in output signals 122. The number of output signals 126a, 126b, . . . 126k comprised in output signals 126 may be different from, or the same as, the number of input signals 112a, 112b, . . . 112m comprised in input signal set 112. For example, in this embodiment, if the number of scan chains 120a, 120b, . . . 120n comprised in circuitry 106 is equal to the number n, and the number of input signals 112a, 112b, . . . 112m comprised in input signal set 112 is equal to the number m, then the number n may be less than or equal to $2^{m-1}$. Each respective input comprised in input signal set 112, each respective stimulus signal comprised in stimulus signal set 116, each respective signal comprised in plurality of signals 122, and each respective signal comprised in plurality of signals 126 may encode a single respective bit value. Of course, the respective numbers and respective types of input signals comprised in input signal set 112, stimulus signals comprised in stimulus signal set 116, output signals comprised in output signals 122, and output signals comprised in output signals 126 may vary from what is shown in the Figures and described herein without departing from this embodiment.

In this embodiment, circuitry 200 may generate each respective stimulus signal comprised in stimulus signal set 116 based, at least in part, upon a respective non-null subset of input signal set 112. As used herein, a "non-null" set or "non-null" subset means a "non-empty" set or "non-empty" subset, respectively. Also in this embodiment, no two respective stimulus signals comprised in stimulus signal set 116 may be generated based upon the same respective non-null subset of input signal set 112. One or more respective stimulus signals in stimulus signal set 116 may be generated based at least in part upon a result of a respective logical exclusive-or of two or more respective input signals in input signal set 112.

Figure 2:
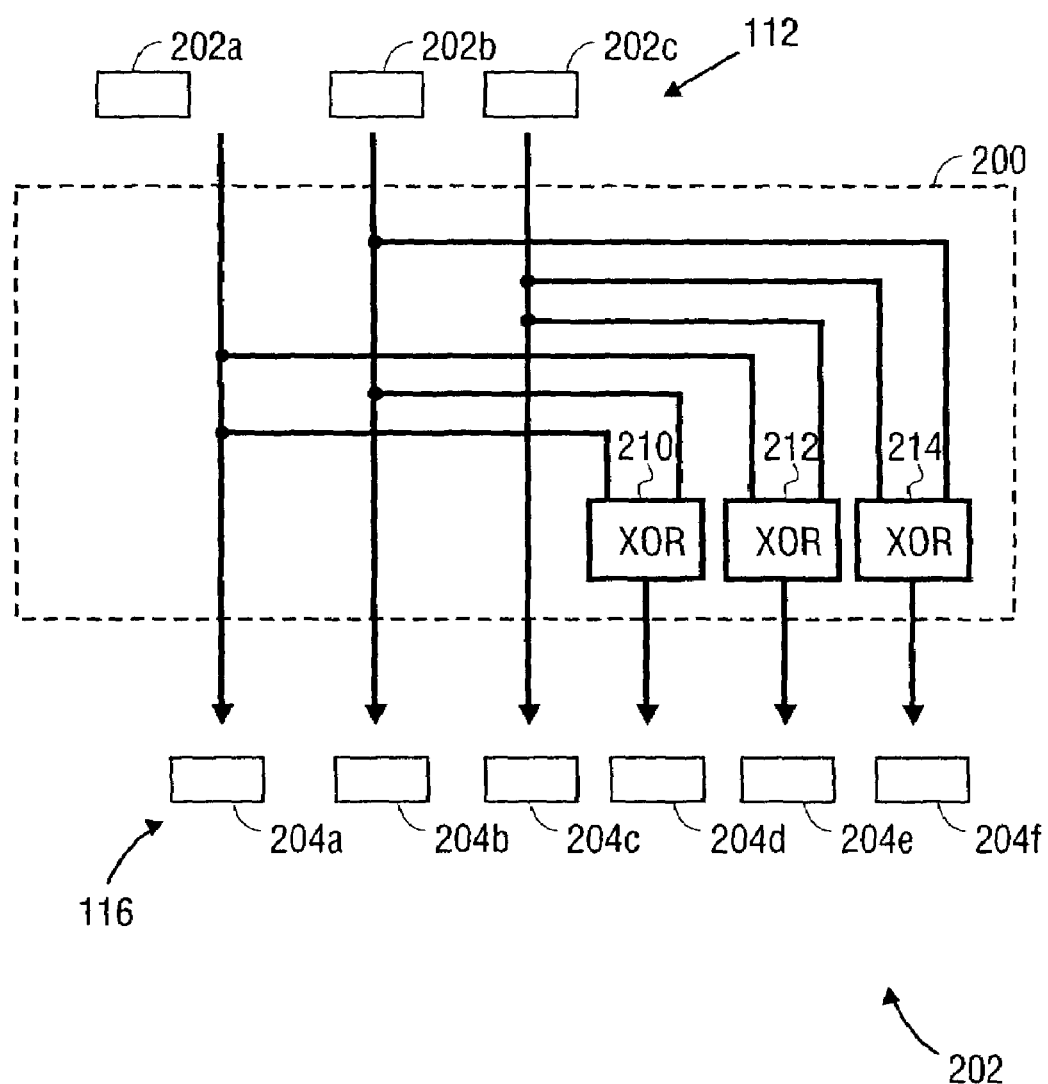
FIG. 2 is a diagram illustrating stimulus generator circuitry according to one embodiment.

For example, for purposes of illustration, FIG. 2 illustrates an example arrangement 202 in which, during each respective clock cycle of system 100, circuitry 200 may receive three respective input signals comprised in input signal set 112, and based at least in part upon these received input signals, circuitry 200 may generate and supply, as inputs, to six respective scan chains in circuitry 106 six respective stimulus signals comprised in stimulus signal set 116. For example, in this embodiment, during a particular clock cycle of system 100, circuitry 200 may receive input signals 202a, 202b, and 202c that may be comprised in input signal set 112. Based, at least in part, upon input signals 202a, 202b, and 202c, circuitry 200 may generate six stimulus signals 204a, 204b, 204c, 204d, 204e, and 204f. For example, in this embodiment, stimulus signals 204a, 204b, and 204c may be identical to input signals 202a, 202b, and 202c, respectively. Stimulus signal 204d may be generated, as output, by exclusive-or gate 210, and may be, for example, the result of a logical exclusive-or operation performed by gate 210 using, as inputs, input signals 202a and 202b. Stimulus signal 204e may be generated, as output, by exclusive-or gate 212, and may be, for example, the result of a logical exclusive-or operation performed by gate 212 using, as inputs, input signals 202a and 202c. Stimulus signal 204f may be generated, as output, by exclusive-or gate 214, and may be, for example, the result of a logical exclusive-or operation performed by gate 214 using, as inputs, input signals 202b and 202c.

Thus, as can be seen from this illustrative example, in this embodiment, circuitry 200 may generate, as respective outputs, respective stimulus signals 204a, 204b, 204c, 204d, 204e, and 204f that may be comprised in stimulus signal set 116. Also in this embodiment, circuitry 200 may generate signals 204a, 204b, 204c, 204d, 204e, and 204f comprised in stimulus signal set 116, based at least in part, upon respective subsets of input signals 202a, 202b, and 202c in input signal set 112. Additionally, in this embodiment, stimulus signals 204a, 204b, 204c, 204d, 204e, and 204f may be supplied, as inputs, to respective scan chains in scan circuitry 106. In accordance with conventional scan test techniques, this may result in these scan chains exchanging data and/or commands with circuitry in integrated circuit 160 that is intended to be tested by scan circuitry 106, and also may result in these scan chains forwarding to compactor circuitry 108 one or more signals comprised in plurality of signals 122. Circuitry 108 may process signals 122 in the manner described previously.

The construction and operation of circuitry 200 described above is merely illustrative, and many alternatives, variations, and modifications are possible without departing from this embodiment. For example, although circuitry 200 has been described above as comprising hard-wired logic that may generate stimulus signal set 116 based at least in part upon input signal set 112, additionally or alternatively, circuitry 200 may comprise programmable circuitry (not shown). This programmable circuitry may comprise, e.g., one or more processors and/or state machines (not shown) that may execute one or more sets of machine-executable program instructions stored in one or more machine-readable memories (not shown) and/or one or more machine-readable media. The execution of these one or more sets of machine-executable program instructions by these one or more processors and/or state machines may result in these one or more processors and/or state machines generating stimulus signal set 116 based at least in part upon input signal set 112, and also may result in these one or more processors and/or state machines supplying stimulus signal set 116 to scan circuitry 106.

Figure 3:
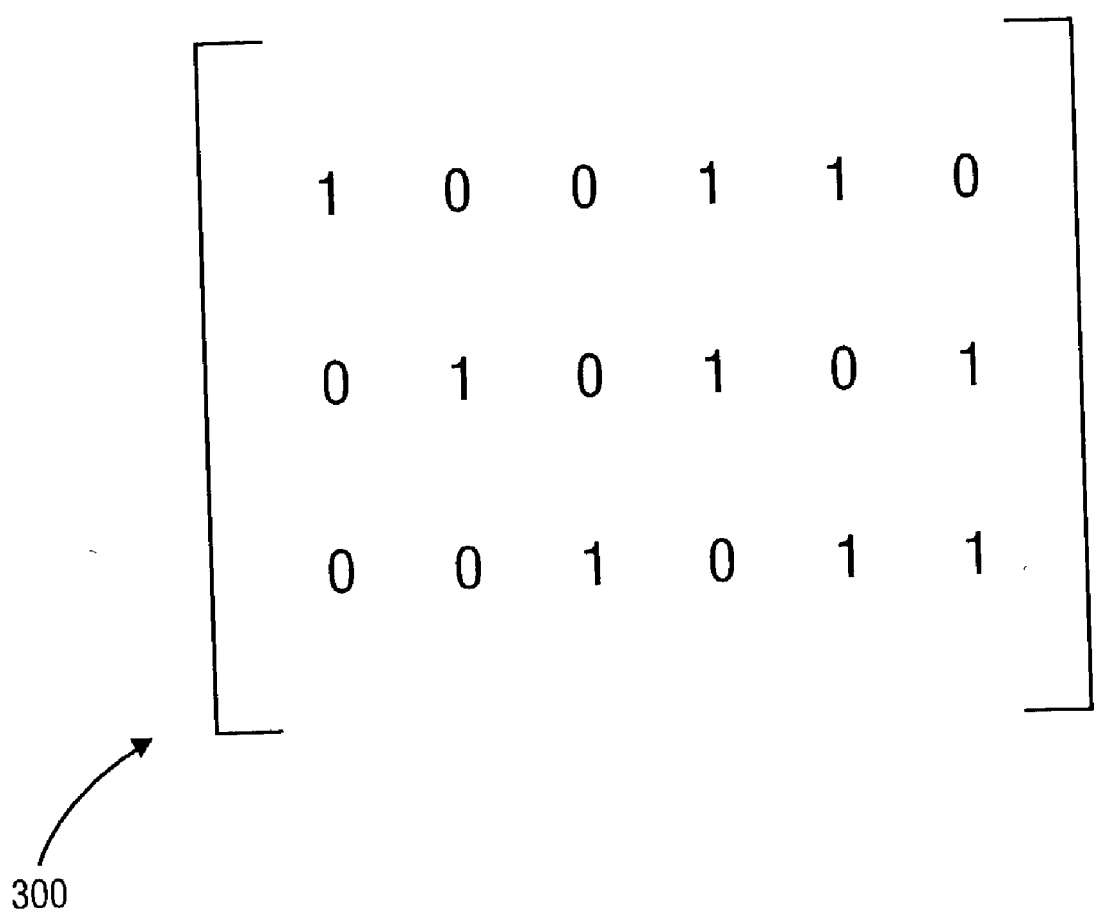
FIG. 3 illustrates a matrix that may be used to represent the circuitry of FIG. 2.

Also, depending upon the respective numbers of input signals in set 112, stimulus signals in set 116, and a specified number of testability bits (whose purpose is described below), the construction and operation of circuitry 200 may vary from that shown in FIG. 2 and described previously. For purposes of illustrating variations in the construction and operation of circuitry 200 that may be possible without departing from this embodiment, a matrix 300 is illustrated in FIG. 3.

Matrix 300 may comprise one or more, and in this embodiment, a plurality of rows. Matrix 300 also may comprise one or more, and in this embodiment, a plurality of columns. Matrix 300 is populated with a plurality of binary values. These binary values may represent, correspond to, and/or describe, at least in part, the construction and/or operation of circuitry 200. For example, in this embodiment, the number of stimulus signals generated by circuitry 200 is equal to the number of columns of matrix 300, and the number of input signals based upon which circuitry 200 may generate these stimulus signals is equal to the number of rows of matrix 300. Also in this embodiment, each column in matrix 300 corresponds to and/or represents a respective stimulus signal in set 116 generated by circuitry 200, and each row in matrix 300 corresponds to and/or represents a respective input signal in set 112 received by circuitry 200. An entry in row x and column y of matrix 300 may be assigned a value of 1 if circuitry 200 generates the y-th stimulus signal generated by circuitry 200 based, at least in part, upon the x-th input signal in set 112 received by circuitry 200. In this embodiment, if two or more entries in the y-th column in matrix 300 are assigned values of 1, then this indicates that the y-th stimulus signal output generated by circuitry 200 is generated based upon logical exclusive-or of respective input signals that correspond to non-zero entries in the y-th column of matrix 300.

Depending upon, for example, specified number of testability bits associated with circuitry 200, further constraints may be imposed upon the values that may populate the entries of matrix 300. As used herein, the "specified number of testability bits" may be a positive integer value that may define a number of scan chains that, in order to permit desired testing of the integrated circuit 160 to be carried out, is required to be supplied with predetermined, specified stimulus signals during testing of the integrated circuit 160; hereinafter this specified number of testability bits may be signified by the letter "S." For example, in system 100, if S=1, then only one scan chain in system 100 needs to be supplied with predetermined, specified stimulus signals in order to permit desired testing of integrated circuit 160 to be carried out, and any other scan chains in system 100 may be supplied with randomly generated values without undesirably affecting the testing of integrated circuit 160. Conversely, if, in system 100, S=2, then two respective scan chains need to be supplied with predetermined, specified stimulus signals in order to permit desired testing of integrated circuit 160 to be carried out, and any other scan chains in system 100 may be supplied with randomly generated values without undesirably affecting the testing of integrated circuit 160, and so forth, for each possible value of S. Depending upon the value of S that is desired, constraints may be imposed on the construction and operation of circuitry 200, as well as, the corresponding values that may populate the matrix that may correspond to and/or represent corresponding features in circuitry 200. These constraints may ensure that the stimulus signals generated by circuitry 200 may result in circuitry 200 being properly associated with the desired value of S.

For example, if S is desired to be equal to 1, then all of the stimulus signals generated by circuitry 200 may be generated based, at least in part, upon a single input signal in set 112, and all columns of the matrix that may correspond to and/or represent circuitry 200 may be non-zero. Conversely, if, as is the case for the embodiment of circuitry 200 shown in FIG. 2, S is desired to be equal to 2, then the number of stimulus signals in set 116 that may be generated by circuitry 200 based at least in part upon input signal set 112, may be equal to n, n may be less than or equal to $2^{m-1}$ (where, as noted above, m is the number of input signals in set 112 received by circuitry 200), and each respective column in matrix 300 may comprise at least one non-zero entry, and no two respective columns in matrix 300 may be identical. Further conversely, if S is desired to be equal to 3, then the number of input signals m in set 112 received by circuitry 200 may be greater than or equal to $1+\log_2 n$, each respective column in matrix 300 may comprise at least one non-zero entry, no two respective columns in matrix 300 may be identical, and each respective column may comprise an identical respective odd number of non-zero entries. Thus, if S is desired to be equal to 3, each respective non-null subset of input signal set 112 upon which each respective stimulus signal comprised in the stimulus signal set 116 may be based, at least in part, may include a respective odd number of input signals of the input signal set 112.

If S is desired to be greater than 3, then the scan chains in circuitry 106 may be divided into a plurality of scan chain clusters of number N. Each of these scan chain clusters may comprise respective scan chains of number C, where C is a positive integer greater than 1.

Depending upon, for example, specified number of scan chain cluster testability bits associated with circuitry 200, further constraints may be imposed upon the values that may populate the entries of matrix 300. As used herein, the "specified number of scan chain testability bits" may be a positive integer value that may define a number of scan chain clusters that, in order to permit desired testing of the integrated circuit 160 to be carried out, is required to be supplied with predetermined, specified stimulus signals during testing of the integrated circuit 160; hereinafter this specified number of scan chain testability bits may be signified by the letter "M." For example, in system 100, if M=1, then only one scan chain cluster in system 100 needs to be supplied with predetermined, specified stimulus signals in order to permit desired testing of integrated circuit 160 to be carried out, and any other scan chain cluster in system 100 may be supplied with randomly generated values without undesirably effecting the testing of integrated circuit 160. Conversely, if, in system 100, M=2, then two respective scan chain clusters need to be supplied with predetermined, specified stimulus signals in order to permit desired testing of integrated circuit 160 to be carried out, and any other scan chain clusters in system 100 may be supplied with randomly generated values without undesirably effecting the testing of integrated circuit 160, and so forth, for each possible value of M.

Depending upon the value of M that is desired, constraints may be imposed on the construction and operation of circuitry 200, as well as, the corresponding values that may populate the matrix that may correspond to and/or represent corresponding features in circuitry 200. These constraints may ensure that the stimulus signals generated by circuitry 200 may result in integrated circuit 160 undergoing desired testing, given the value of M. If it is desired that S be greater than 3, then the number of input signals in set 112 that may be supplied to generator circuitry 200 may be equal to M multiplied by C. Matrix 300 may be determined empirically so as to ensure that the desired values of N, C, and M are satisfied, using, for example, well known Bose, Chaudhuri, and Hocquenghem (BCH) and Reed Solomon error correction and detection code techniques. For example, the stimulus signal set may be divided into non-null stimulus signal subsets, and the respective non-null subset of the input signal set upon which each respective stimulus signal in each respective non-null stimulus signal subset is based, at least in part, may selected using, at least in part, one or more error correction and detection code techniques selected from Bose, Chaudhuri, and Hocquenghem and Reed Solomon error correction and detection code techniques.

Alternatively or additionally, brute-force methods may be used to empirically determine matrix 300 so as to ensure that the desired values of N, C, and M are satisfied, and also so that any group of S columns in matrix are linearly independent. Of course, the foregoing techniques for determining matrix 300 are presented for purposes of illustration and are not exclusive, and other techniques may be employed to determine matrix 300 without departing from this embodiment.

Figure 4:
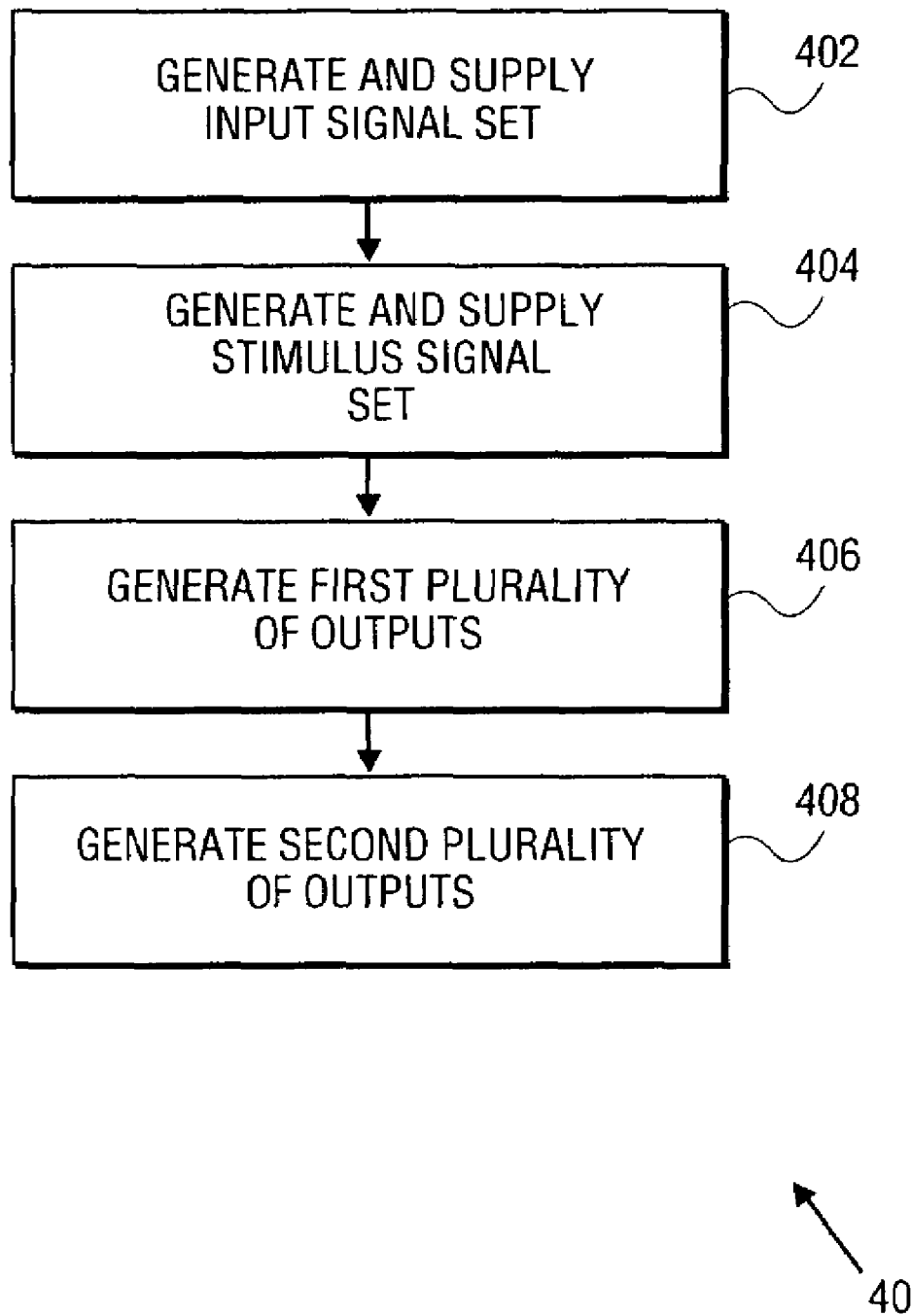
FIG. 4 is a flowchart illustrating operations, according to an embodiment, that may be carried out in the system of FIG. 1.

Turning now to FIG. 4, operations 400 that may be carried out in system 100 in order to facilitate and/or carry out testing of integrated circuit 160, in accordance with one embodiment, will be described. Operations 400 may commence with generation and supplying of input signal set 112 to test stimulus generator circuitry 104 by test input generator circuitry 102, as illustrated by operation 402 in FIG. 4. Thereafter, in response to and/or based, at least in part, upon input signal set 112, circuitry 104 may generate stimulus signal set 116, and may supply stimulus signal set 116 to scan circuitry 106, as illustrated by operation 404. Thereafter, in response to and/or based, at least in part, upon stimulus signal set 116, scan circuitry 106 may generate and supply a plurality of output signals 122 to test output compactor circuitry 108, as illustrated by operation 406 in FIG. 4. In response to and/or based, at least in part, upon output signals 122, test output compactor circuitry 108 may generate and supply to test analyzer circuitry 110 another plurality of output signals 126, as illustrated by operation 408. Test analyzer circuitry 110 may determine, for example, based at least in part upon output signals 126 whether circuitry in integrated circuit 160 that is intended to be tested by scan circuitry 106 is functioning properly. For example, test analyzer circuitry 110 may compare output signals 126 to predetermined expected output signals. Based at least in part upon such comparison, circuitry 110 may determine whether one more errors (e.g., differences between output signals 126 and the predetermined expected output signals) may be present in the output signals 126 that may evidence one or more malfunctions in integrated circuit 160 and/or the types and/or nature of such malfunctions.

In summary, one system embodiment may comprise, for example, an integrated circuit comprising first circuitry and second circuitry. The first circuitry may be capable of generating a stimulus signal set to be supplied, as input, to the second circuitry. Each respective stimulus signal comprised in the stimulus signal set may be generated based at least in part upon a respective non-null subset of an input signal set. No two respective stimulus signals comprised in the stimulus signal set may be generated based upon the same respective non-null subset of the input signal set. The stimulus signal set may comprise a respective number of stimulus signals that is greater than a respective number of input signals comprised in the input signal set.

Advantageously, these features of this system embodiment may permit the time consumed by, and the volume of test input data supplied to the integrated circuit during the testing of circuitry in the integrated circuit in this system embodiment to be greatly reduced compared to the prior art. Additionally, in this system embodiment, the number of input and/or output terminals of the integrated circuit involved in carrying out such testing may be reduced compared to the prior art. Further advantageously, in this system embodiment relatively inexpensive test input generator and test analyzer circuitry may be employed.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims.

For example, depending upon the circuitry in integrated circuit 160 that is intended to be tested by a given scan chain (e.g., scan chain 120n), in order to permit desired testing of such circuitry in integrated circuit 160 to be carried out, it may be necessary to supply a relatively greater number of predetermined, specified stimulus signals to the given scan chain. In this situation, circuitry 102 may supply one or more control signals 130 to circuitry 104 that may result in input terminal 114m being directly coupled via signal line 134 to signal line 118m. This may result in scan chain 120n being directly coupled to circuitry 102 such that, for example, a plurality of input signals supplied to circuitry 104 from circuitry 102 via input terminal 114m may by-pass circuitry 200, and instead, may be supplied directly as inputs to scan chain 120n. The number of such input signals that may be so supplied to scan chain 120n may be calculated, using well-known testing and error correction and detection techniques, so as to ensure that a desired minimum number of errors that may be present in output signals from scan chain 120n may be detectable (e.g., by circuitry 110).

Many other modifications are also possible. Accordingly, the claims are intended to cover all such equivalents.

What is claimed is:

1. A method comprising:
generating a stimulus signal set to be supplied, as input, to circuitry, each respective stimulus signal comprised in the stimulus signal set being generated based at least in part upon a respective non-null subset of an input signal set, no two respective stimulus signals comprised in the stimulus signal set being generated based upon the same respective non-null subset of the input signal set, the stimulus signal set comprising a respective number of stimulus signals that is greater than a respective number of input signals comprised in the input signal set.

2. The method of claim 1, wherein:
one or more respective stimulus signals comprised in the stimulus signal set are generated based at least in part upon a result of a respective exclusive-or of two or more respective input signals comprised in the input signal set.

3. The method of claim 1, wherein:
the circuitry comprises a plurality of scan chains, and each of the scan chains is coupled to one respective stimulus signal comprised in the stimulus signal set.

4. The method of claim 3, wherein:
the plurality of scan chains comprises a respective number n of scan chains, and the number n is less than or equal to $2^{m-1}$, where m is equal to the respective number of input signals comprised in the input signal set.

5. The method of claim 1, wherein:
each respective non-null subset upon which each respective stimulus signal comprised in the stimulus signal set is based, at least in part, includes a respective odd number of input signals of the input signal set.

6. The method of claim 1, wherein:
each respective non-null subset upon which each respective stimulus signal comprised in the stimulus signal set is based, at least in part, includes a respective odd and equal number of input signals of the input signal set.

7. The method of claim 1, wherein:
an integrated circuit comprises the circuitry and also comprises circuitry to generate, at least in part, the stimulus signal set; and
circuitry external to the integrated circuit generates, at least in part, the input signal set.

8. The method of claim 1, further comprising:
dividing the stimulus signal set into non-null stimulus signal subsets; and
selecting the respective non-null subset of the input signal set upon which each respective stimulus signal in each respective non-null stimulus signal subset is based, at least in part, the selecting of the respective non-null subset of the input signal comprising using, at least in part, one or more error correction and detection code techniques selected from Bose, Chaudhuri, and Hocquenghem and Reed Solomon error correction and detection code techniques.

9. An apparatus comprising:
first circuitry to generate a stimulus signal set to be supplied, as input, to second circuitry, each respective stimulus signal comprised in the stimulus signal set being generated based at least in part upon a respective non-null subset of an input signal set, no two respective stimulus signals comprised in the stimulus signal set being generated based upon the same respective non-null subset of the input signal set, the stimulus signal set comprising a respective number of stimulus signals that is greater than a respective number of input signals comprised in the input signal set.

10. The apparatus of claim 9, wherein:
the first circuitry is capable of generating one or more respective stimulus signals comprised in the stimulus signal set based at least in part upon a result of a respective exclusive-or of two or more respective input signals comprised in the input signal set.

11. The apparatus of claim 9, wherein:
the second circuitry comprises a plurality of scan chains, and each of the scan chains is coupled to one respective stimulus signal comprised in the stimulus signal set.

12. The apparatus of claim 11, wherein:
the plurality of scan chains comprises a respective number n of scan chains, and the number n is less than or equal to $2^{m-1}$, where m is equal to the respective number of input signals comprised in the input signal set.

13. The apparatus of claim 9, wherein:
each respective non-null subset upon which each respective stimulus signal comprised in the stimulus signal set is based, at least in part, includes a respective odd number of input signals of the input signal set.

14. The apparatus of claim 9, wherein:
each respective non-null subset upon which each respective stimulus signal comprised in the stimulus signal set is based, at least in part, includes a respective odd and equal number of input signals of the input signal set.

15. The apparatus of claim 9, further comprising:
an integrated circuit that comprises the first circuitry and the second circuitry; and
third circuitry external to the integrated circuit to generate, at least in part, the input signal set.

16. The apparatus of claim 9, wherein:
the stimulus signal set is divided into non-null stimulus signal subsets; and
the respective non-null subset of the input signal set upon which each respective stimulus signal in each respective non-null stimulus signal subset is based, at least in part, is selected using, at least in part, one or more error correction and detection code techniques selected from Bose, Chaudhuri, and Hocquenghem and Reed Solomon error correction and detection code techniques.

17. An article comprising:
a storage medium having stored thereon instructions that when executed by a machine result in the following:
generating a stimulus signal set to be supplied, as input, to circuitry, each respective stimulus signal comprised in the stimulus signal set being generated based at least in part upon a respective non-null subset of an input signal set, no two respective stimulus signals comprised in the stimulus signal set being generated based upon the same respective non-null subset of the input signal set, the stimulus signal set comprising a respective number of stimulus signals that is greater than a respective number of input signals comprised in the input signal set.

18. The article of claim 17, wherein:
one or more respective stimulus signals comprised in the stimulus signal set are generated based at least in part upon a result of a respective exclusive-or of two or more respective input signals comprised in the input signal set.

19. The article of claim 17, wherein:
the circuitry comprises a plurality of scan chains, and each of the scan chains is coupled to one respective stimulus signal comprised in the stimulus signal set.

20. The article of claim 19, wherein:
the plurality of scan chains comprises a respective number n of scan chains, and the number n is less than or equal to $2^{m-1}$, where m is equal to the respective number of input signals comprised in the input signal set.

21. The article of claim 17, wherein:
each respective non-null subset upon which each respective stimulus signal comprised in the stimulus signal set is based, at least in part, includes a respective odd number of input signals of the input signal set.

22. The article of claim 17, wherein:
each respective non-null subset upon which each respective stimulus signal comprised in the stimulus signal set is based, at least in part, includes a respective odd and equal number of input signals of the input signal set.

23. The article of claim 17, wherein:
an integrated circuit comprises the circuitry and also comprises circuitry to generate, at least in part, the stimulus signal set; and
circuitry external to the integrated circuit generates, at least in part, the input signal set.

24. The article of claim 17, wherein:
the stimulus signal set is divided into non-null stimulus signal subsets; and
the respective non-null subset of the input signal set upon which each respective stimulus signal in each respective non-null stimulus signal subset is based, at least in part, is selected using, at least in part, one or more error correction and detection code techniques selected from Bose, Chaudhuri, and Hocquenghem and Reed Solomon error correction and detection code techniques.

25. A system comprising:
an integrated circuit comprising first circuitry and second circuitry, the first circuitry being capable of generating a stimulus signal set to be supplied, as input, to the second circuitry, each respective stimulus signal comprised in the stimulus signal set being generated based at least in part upon a respective non-null subset of an input signal set, no two respective stimulus signals comprised in the stimulus signal set being generated based upon the same respective non-null subset of the input signal set, the stimulus signal set comprising a respective number of stimulus signals that is greater than a respective number of input signals comprised in the input signal set.

26. The system of claim 25, further comprising:
third circuitry to receive a first plurality of outputs from the second circuitry, the second circuitry being capable of generating the first plurality of outputs in response at least in part to the stimulus signal set, the third circuitry being capable of generating a second plurality of outputs in response at least in part to the first plurality of outputs, the first plurality of outputs comprising a respective number of outputs that is greater than a respective number of outputs comprised in the second plurality of outputs.

27. The system of claim 26, wherein:
the integrated circuit comprises the third circuitry.

28. The system of claim 26, further comprising:
test input generator circuitry to generate and supply to the first circuitry the input signal set, the test input generator circuitry being external to the integrated circuit.

29. The system of claim 26, further comprising:
test analyzer circuitry to receive the second plurality of outputs.

30. The system of claim 25, wherein:
the first circuitry also is capable of receiving one or more control signals; and
in response at least in part to the one or more control signals, the first circuitry is capable of directly coupling the second circuitry to one or more external terminals of the integrated circuit.

31. The system of claim 30, wherein:

the second circuitry comprises a plurality of scan chains;

the first circuitry is capable of supplying the stimulus signal set to the scan chains;

the one or more control signals indicate, at least in part, which of the scan chains are to be directly coupled by the first circuitry to the one or more external terminals; and in response at least in part to the one or more control signals, the first circuitry is capable of directly coupling one or more of the scan chains indicated, at least in part, by the one or more control signals to the one or more external terminals.

32. The system of claim 25, wherein:

the second circuitry comprises a plurality of scan chains;

in response at least in part to one or more control signals, the second circuitry is capable of coupling together at least two of the scan chains to form at least one relatively longer scan chain relative to at least one relatively shorter scan chain; and the first circuitry is capable of supplying to the at least one relatively longer scan chain and the at least one relatively shorter scan chain respective stimulus signals comprised in the stimulus signal set.

* * * * *